(12) United States Patent
Hachiya

(10) Patent No.: US 7,167,028 B2
(45) Date of Patent: Jan. 23, 2007

(54) VOLTAGE DETECTION CIRCUIT, POWER SUPPLY UNIT AND SEMICONDUCTOR DEVICE

(75) Inventor: Yoshiaki Hachiya, Ohtsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 80 days.

(21) Appl. No.: 11/100,403

(22) Filed: Apr. 7, 2005

(65) Prior Publication Data

US 2005/0225360 A1    Oct. 13, 2005

(30) Foreign Application Priority Data

Apr. 13, 2004    (JP) ............... 2004-117898

(51) Int. Cl.
  *H03K 5/22*    (2006.01)
  *H03K 5/153*    (2006.01)

(52) U.S. Cl. .............. 327/77; 327/103; 327/543; 363/21.1

(58) Field of Classification Search .......... 327/77, 327/103

See application file for complete search history.

(56) References Cited

U.S. PATENT DOCUMENTS

| | | | | |
|---|---|---|---|---|
| 4,789,821 | A | 12/1988 | Baschiera et al. | 714/732 |
| 6,154,377 | A * | 11/2000 | Balakrishnan et al. | 363/21.01 |
| 6,212,079 | B1 * | 4/2001 | Balakrishnan et al. | 363/21.03 |
| 2003/0090253 | A1 | 5/2003 | Balakrishnan | 323/282 |

FOREIGN PATENT DOCUMENTS

| | | |
|---|---|---|
| JP | 62217170 | 9/1987 |
| JP | 2002-315311 | 10/2002 |
| JP | 2003-158872 | 5/2003 |
| JP | 2003-333828 | 11/2003 |

OTHER PUBLICATIONS

"Feature—All of the Latest Power Supply Circuit Designing Techniques," Transistor Technology Special Issue, CQ Press, Jul. 1, 1991, No. 28, pp. 130 and 131, with partial English translation.

(Continued)

*Primary Examiner*—Quan Tra
(74) *Attorney, Agent, or Firm*—Stevens, Davis, Miller & Mosher, LLP

(57) ABSTRACT

An output signal of an error amplifier 5, which has a reference terminal to which a voltage having no temperature characteristics fluctuation is applied and which has a detection terminal to which a voltage detecting terminal VO2 is connected, is transmitted to the control terminal of a switching element 6. Voltage fluctuation at the voltage detecting terminal VO2 is output as a current signal by a V-1 conversion circuit constituted by a current mirror circuit having a constant current source 4, the switching element 6, and switching elements 7 and 8 to a detected signal output terminal PC via the error amplifier 5. The signal is transmitted to the outside by a optical coupler 14 to control a voltage at an output voltage terminal VOUT. A voltage detection circuit, in which a desired voltage is acquired by controlling voltages at terminals supplied with power, exhibiting lower power consumption and improved voltage detection accuracy and a power supply unit having low ripple voltage and a reduced components count are implemented.

11 Claims, 16 Drawing Sheets

OTHER PUBLICATIONS

"Feature—All of the Latest Switching Power Supply Techniques," Transistor Technology Special Issue, CQ Press, Jan. 1, 1997, No. 57, pp. 77 and 86, with partial English translation.

Japanese Office Action dated Aug. 31, 2006 with English translation.

* cited by examiner

VOLTAGE DETECTION CIRCUIT, POWER SUPPLY UNIT AND SEMICONDUCTOR DEVICE

BACKGROUND OF THE INVENTION

1. Field of the Invention

The present invention relates to a voltage detection circuit used for output voltage detection portions and so on for power supply units (such as switching power supplies), a power supply unit using the voltage detection circuit, and a semiconductor device used for the voltage detection circuit.

2. Background Art

FIG. 14 is a circuit diagram for showing a voltage detection portion used for a conventional power supply unit. FIG. 15 is a waveform graph for showing operation at each terminal in the conventional voltage detection portion shown in FIG. 14. FIG. 16 is a circuit diagram for showing an exemplary power supply unit using the voltage detection portion shown in FIG. 14.

According to the conventional voltage detection circuit, a voltage at an output voltage terminal VOUT is divided based on a resistance ratio of resistors 34 and 35 and is detected by a shunt regulator 32. A capacitor 13 is connected to the output voltage terminal VOUT and is externally supplied with a charge, which increases the voltage at the output voltage terminal VOUT. The detected voltage level VO at the output voltage terminal VOUT is expressed by the following equation:

$$VO = Vth \cdot (R34 + R35)/R34$$

wherein Vth denotes the threshold voltage of the shunt regulator 32, R34 denotes the resistance of the resistor 34, and R35 denotes the resistance of the resistor 35.

In order to stably control the detected voltage level VO, the following steps are necessary:

(1) the resistor 36 and the capacitor 37 are connected in series to each other as shown in FIG. 14; and (2) an detected current value to the shunt regulator 32 is increased by additionally connecting a resistor 33 as shown in FIG. 14 in order to stabilize the detected voltage level.

FIG. 15 is a graph for showing the waveforms of current 132 which flows through the output voltage terminal VOUT, VO, and the shunt regulator 32 in the voltage detection circuit shown in FIG. 14. The ripple voltage at the output voltage terminal VOUT is determined by the time constant of the resistor 36 and the capacitor 37 (since it is necessary to give hysteresis characteristics).

FIG. 16 is a circuit diagram for showing an exemplary power supply unit wherein the conventional voltage detection circuit shown in FIG. 14 is used as a secondary voltage detection circuit. In FIG. 16, reference numeral 18 denotes a rectifier circuit, 19 denotes a transformer, 19a denotes the primary winding of the transformer, 19b denotes the secondary winding of the transformer, 20 denotes an input voltage source, 21 denotes a filter circuit, 22 denotes a rectifier circuit, 23 denotes an smoothing capacitor on the input side, 24 denotes a snubber circuit, 25 denotes a control circuit, 26 denotes a switching element, 27 denotes an section incorporated on a single semiconductor substrate, and 28 denotes a capacitor.

In this case, a optical coupler 14 is used as a detected signal transfer unit. When a voltage is detected by the conventional voltage detection circuit shown in FIG. 4, the shunt regulator 32 is brought into conduction, so that a current flows into the light emitting portion 14a of the optical coupler 14 to emit light (the output of the detected signal). The output of the detected signal taking the form of the light emission is detected by the light-receiving portion 14b of the optical coupler 14, and the on-off control of the switching element 26 effected by the primary control circuit 25 is stopped (or suspended). As a result, energy supply from the primary side to the secondary side is stopped (or suspended), which lowers the voltage at the output voltage terminal VOUT gradually. When the voltage at the output voltage terminal VOUT goes down to below the detection voltage level, the output of the detection signal from the optical coupler 14 and the shunt regulator 32 goes off, so that the on-off control of the switching element 26 effected by the control circuit 25 is resumed to supply energy from the primary side to the secondary side, which increases the voltage at the output voltage terminal VOUT. The ripple voltage at the output voltage terminal VOUT varies according to the loaded state of the input voltage terminal VOUT since the ripple voltage is dependent upon the time constant of the resistor 36 and the capacitor 37.

As to the voltage detection circuit, the following references are provided.

Reference 1: "Feature—All of the Latest Power Supply Circuit Designing Techniques", Transistor Technology• Special Issue, CQ Press, Jul. 1, 1991, No. 28, p. 13.

Reference 2: "Feature—All of the Latest Switching Power Supply Techniques", Transistor Technology• Special Issue, CQ Press, Jan. 1, 1997, No. 57, p. 86.

However, the conventional voltage detection circuit has the following problems.

(1) In order to increase voltage detection accuracy, it is necessary to increase the current value of the current 132 which flows into the shunt regulator 32. However, the current flowing during detection is generally on the order of several milliamperes, which interferes with the achievement of higher efficiency (that is, energy savings) being addressed on a worldwide basis at present. Also, in order not to decrease the voltage detection accuracy when the current value of the current I32 flowing into the shunt regulator 32 is insufficient, it is necessary to add the resistor 33, which also increase the number of components of the circuit in addition to the reason set forth below.

(2) Since the voltage control at the output voltage terminal VOUT is dependent on the time constant of the resistor 36 and the capacitor 37, the ripple voltage range at the output voltage terminal VOUT varies depending on the state of the load, which may cause increased ripple voltage.

(3) The components of the voltage detection circuit are large in number (at least eight components are required as shown in FIG. 14).

(4) Being dependent on the temperature characteristics of the threshold of the shunt regulator 32, the temperature characteristics of the voltage at the output voltage terminal VOUT are poor.

SUMMARY OF THE INVENTION

An object of the present invention is to provide a voltage detection circuit, a power supply unit, and a semiconductor device which are intended to improve voltage detection accuracy, reduce power consumption, suppress ripple voltage at an output terminal, and have a lower components count.

The voltage detection circuit of the invention includes a first smoothing capacitor, first and second resistors, an error amplifier, a regulator, a second capacitor, a first switching element, a first constant current source, a current mirror circuit, a switching element for starting, and a start-stop circuit. The first smoothing capacitor is connected between an output terminal on the high potential side and an output terminal on the low potential side. The first and second resistors are connected in series to each other between the output terminal on the high potential side and the output terminal on the low potential side. The error amplifier amplifies an error voltage between a first voltage, which is determined by dividing a desired voltage between the output terminal on the high potential side and the output terminal on the low potential side by the first and second resistors, and a second voltage, which is determined by dividing an actual voltage between the output terminal on the high potential side and the output terminal on the low potential side by the first and second resistors, and outputs the error voltage amplified. The regulator outputs a steady potential to a reference voltage terminal when a high potential is supplied to the output terminal on the high potential side. The second capacitor is connected between the reference voltage terminal and the output terminal on the low potential side. The first switching element has a control terminal connected to the output terminal of the error amplifier. The first constant current source is connected between the reference voltage terminal and the terminal on the high potential side of the first switching element. The current mirror circuit feeds a current, which is predetermined times larger than a current which flows from the first constant current source, into a detected signal output terminal according to the state of the first switching element. The switching element for starting is connected between the reference voltage terminal and the control terminal of the first switching element. The start-stop circuit brings the switching element for starting to an OFF state when the potential at the reference voltage terminal is higher than or equal to a predetermined starting potential and brings the switching element for starting to an ON state when the potential at the reference voltage terminal is less than the predetermined starting potential.

According to the configuration, since the current signal, which has linearity on the voltage fluctuation of the second voltage input into the error amplifier, is output to the detected signal output terminal, it becomes possible to transmit a signal suitable for detected voltage fluctuation by a detected signal transmitting unit such as a optical coupler, which improves the voltage detection accuracy and does not cause fluctuation in the temperature characteristics of the detected voltage. In addition, since the current at the detected signal out terminal can be controlled by a mirror ratio of the current mirror circuit, the voltage detection circuit using a smaller current and exhibiting reduced power consumption is to be implemented. Further, since the error amplifier is used for voltage detection, the first and second resistors can be set to any resistance value, which allows further reduced power consumption. Still further, by controlling the voltage detection circuit so as to supply a desired voltage between the output terminal on the high potential side and the output terminal on the low potential side, the ripple voltage at the output terminal can be suppressed.

In the voltage detection circuit of the invention, the current mirror circuit may include a second switching element and a third switching element in addition to the first constant current source and the first switching element. In the second switching element, a control terminal and a terminal on the high potential side are connected to the terminal on the low potential side of the first switching element, and a terminal on the low potential side is connected to the output terminal on the low potential side. In the third switching element, a control terminal is connected to the control terminal of the second switching element, a terminal on the high potential side is connected to the detected signal output terminal, and a terminal on the low potential side is connected to the output terminal on the low potential side.

Also, the current mirror circuit may have a resistor to be connected between the first constant current source and the first switching element. By having the resistor, the linearity of the current at the detected signal output terminal on the voltage fluctuation between the output terminal on the high potential side and the output terminal on the low potential side can be improved when a load between both output terminals is a light load.

Further, the current mirror circuit may have a second constant current source to be connected in parallel to the first constant current source and the first switching element. By having the second constant current source, the second and third switching elements are always brought to an ON state during voltage detection between the output terminal on the high potential side and the output terminal on the low potential side, which makes it possible to ensure the voltage detecting operation of the voltage detection circuit.

Still further, the voltage detection circuit of the invention may have a detected signal transmission unit to be connected to the detected signal output terminal and to transmit a signal corresponding to the current, which flows into the detected signal output terminal, to the outside.

Furthermore, it is preferable that the voltage detection circuit of the invention incorporate the error amplifier, the regulator, the switching element for starting, the start-stop circuit, and the current mirror circuit into a single semiconductor device, which allows the voltage detection circuit itself to have a lower components count, become smaller in size, and be fabricated at a lower cost.

The power supply unit of the invention employs the voltage detection circuit of the invention at its output voltage detection section where a desired voltage is acquired by controlling a voltage between the output terminal on the high potential side and the output terminal on the low potential side, which allows the power supply unit itself to become more efficient and have lower ripple voltage.

The semiconductor device of the invention includes the error amplifier, the regulator, the switching element for starting, the start-stop circuit, and the current mirror circuit which are components of the voltage detection circuit of the invention.

DESCRIPTION OF THE PREFERRED EMBODIMENTS

In the following, embodiments of the present invention will be explained.

(First Embodiment)

Figure 1:
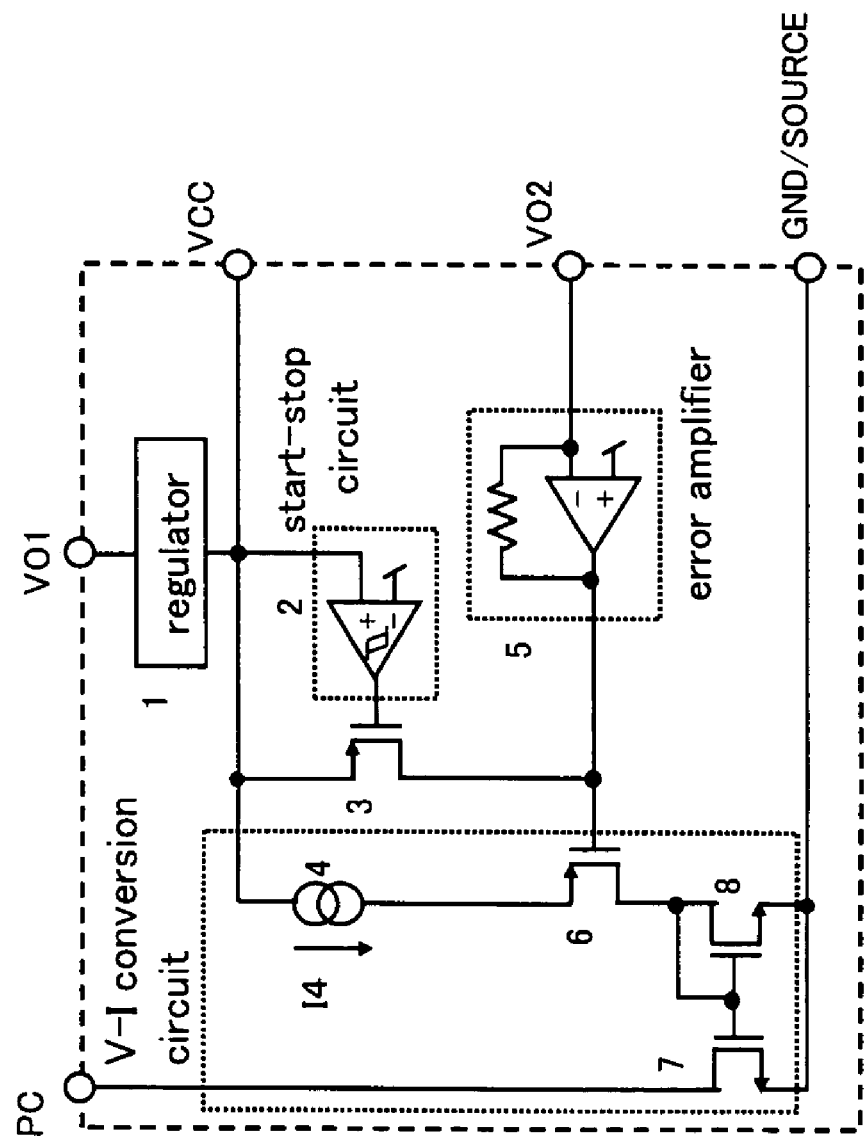
FIG. 1 is a circuit diagram showing the configuration of a semiconductor device according to a first embodiment of the present invention.
Figure 2:
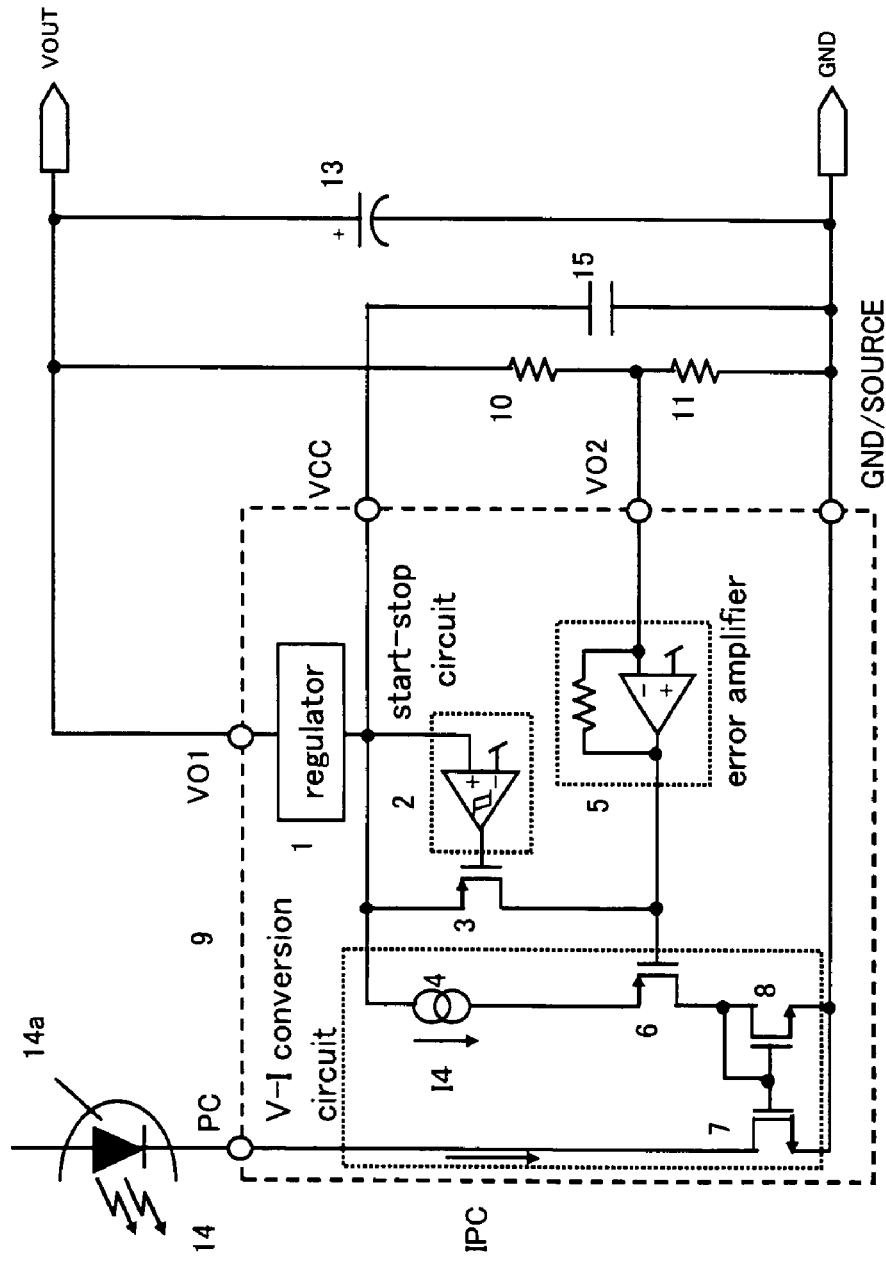
FIG. 2 is a circuit diagram showing a voltage detection circuit according to the first embodiment of the invention.
Figure 3:
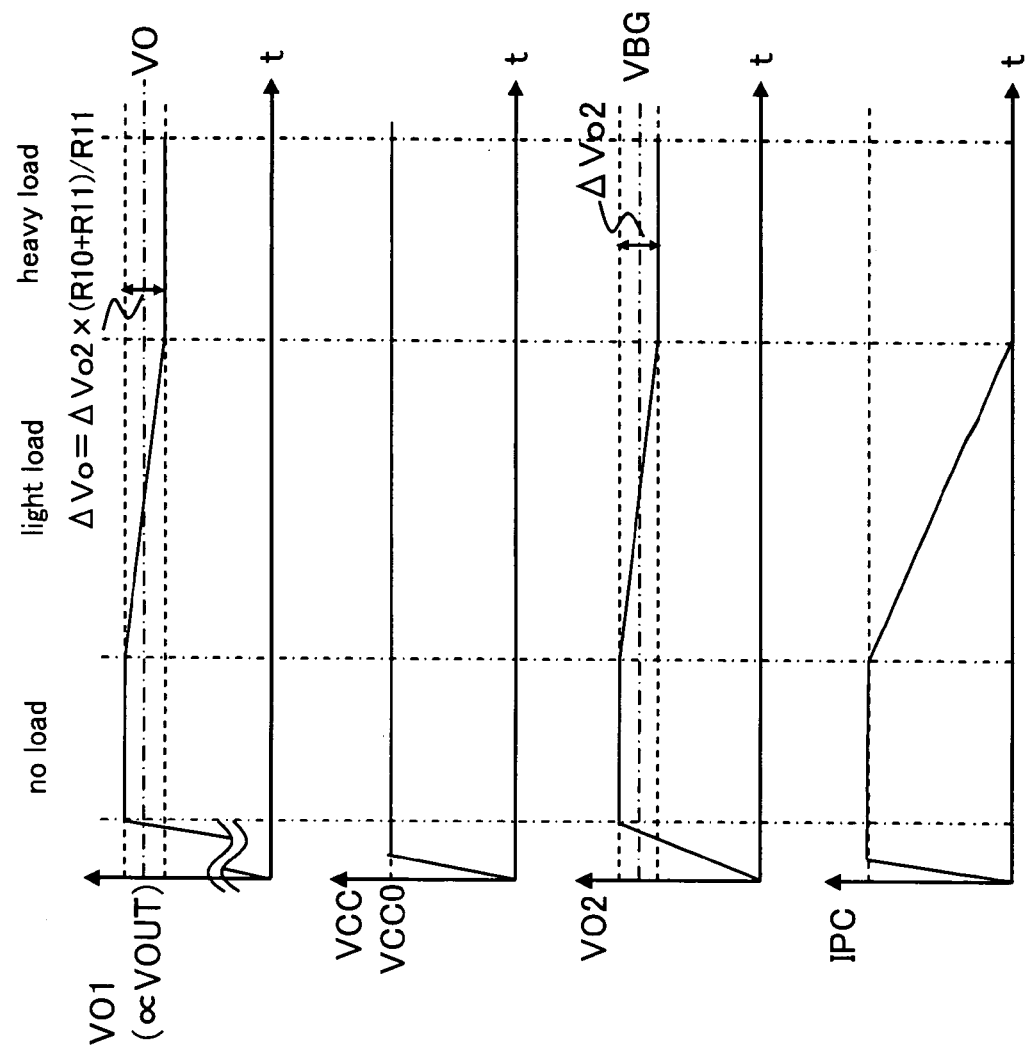
FIG. 3 is a waveform graph showing the operation of the voltage detection circuit shown in FIG. 2.

FIG. 1 is a circuit diagram showing the configuration of a semiconductor device according to a first embodiment of the invention. FIG. 2 is a circuit diagram showing a voltage detection circuit using the semiconductor device shown in FIG. 1. FIG. 3 is a graph showing the waveform of voltages at the terminal VO1 of the voltage detection circuit, the waveform of voltages at the terminal VCC of the voltage detection circuit, the waveform of voltages at the terminal VO2 of the voltage detection circuit, and the waveform of currents IPC.

The semiconductor device (semiconductor chip) shown in FIG. 1 has a total of five terminals, that is, the power supply terminal VO1 used for supplying power, the reference voltage terminal VCC, the voltage detecting terminal VO2, a detected signal output terminal PC used for transmitting detected signals, and a grounding terminal GND/SOURCE as external terminals. A regulator 1 is placed between the terminals VO1 and VCC and keeps the voltage of the reference voltage terminal VCC constant at all times during operation. To the reference voltage terminal VCC, a start-up/shut-down circuit 2, a switching element 3, and a constant current source 4 are connected. To the terminal of the switching element 3 on the low-voltage side, an error amplifier 5 and the control circuit of a switching element 6 are connected. The error amplifier 5 has a reference terminal (terminal on the plus side) to which a voltage having no temperature characteristics fluctuation is applied, and the voltage detecting terminal VO2 is connected to the detection terminal (terminal on the minus side) of the error amplifier 5 to transmit an output signal to the control terminal of the switching element 6. The constant current source 4 is connected to the terminal of the switching element 6 on the high-voltage side. The control terminals of switching elements 7 and 8 and the terminal of the switching element 8 on the high-voltage side are connected to the terminal of the switching element 6 on the low-voltage side. A detected signal output terminal PC is connected to the terminal of the switching element 7 on the high-voltage side. Here the voltage fluctuation at the voltage detecting terminal VO2 is output via the error amplifier 5 to the detected signal output terminal PC as a current signal by a V–1 conversion circuit comprising a current mirror circuit which includes the constant current source 4, the switching element 6, the switching element 7, and the switching element 8.

A voltage detection circuit shown in FIG. 2 employs the semiconductor device 9 shown in FIG. 1. The terminal VO1 of the semiconductor device 9 is connected to an output voltage terminal VOUT for detecting voltage, and the terminal VO2 is connected to the node of a resistor 10 (its resistance value is denoted as R10) and a resistor 11 (its resistance value is denoted as R11) which are connected in series to each other between the output voltage terminal VOUT and the GND/SOURCE terminal. The light emitting portion 14a of a optical coupler 14 is connected to the terminal PC as a detected signal output unit, and a capacitor 15 is connected to the terminal VCC. When the light emitting portion 14a of the optical coupler does not emit light, a capacitor 13 connected to the output voltage terminal VOUT is supplied with power. When the light emitting portion 14a of the optical coupler emits light, power supply to the capacitor is stopped.

The operation of the voltage detection circuit according to the embodiment will be explained using FIG. 2.

When the capacitor 13 connected to the output voltage terminal VOUT is supplied with power, voltages at both ends of the capacitor 13 rise. Because of this, a current is supplied from the terminal VO1 of the voltage detecting semiconductor device 9 connected to the output voltage terminal VOUT to the capacitor 15 connected to the terminal VCC via the regulator 1, and the voltage at the terminal VCC rises as well. When the voltage at the terminal VCC exceeds a starting voltage VCCO set at the start-stop circuit 2, the voltage detecting semiconductor device 9 starts up, and an output signal from the start-stop circuit 2 changes from a "L(low)" signal to a "H (high)" signal. As result, the state of the switching element 3 changes from an ON state to an OFF state, so that the transmission of the voltage fluctuation at the voltage detecting terminal VO2 to the switching element 6 by the error amplifier 5 is started. Here a current is supplied from the output voltage terminal VOUT to the capacitor 15 connected to the terminal VCC via the regulator 1, so that the terminal VCC is controlled by the regulator 1 so as to have a constant voltage VCCO. The voltage detecting semiconductor device 9 is supplied with power from the capacitor 15, and each circuit block is intended to have lower power consumption.

With the rise in the voltage at the output voltage terminal VOUT, the voltage at the terminal VCC is also raised by the regulator 1 connected to the terminal VO1. When the voltage at the terminal VCC reaches VCCO, the output signal of the start-stop circuit 2 changes from the "L(low)" signal to the "H(high)" signal, so that the control of the switching element 6 is started by the output signal of the error amplifier 5, and the voltage detecting semiconductor device 9 starts the detection of the voltage at the output voltage terminal VOUT at the terminal VO2.

When the voltage at the output voltage terminal VOUT is further increased, the voltage at the terminal VO2 created by the division of the voltage at the output voltage terminal VOUT by the resistors 10 and 11 is also increased. As a result, an output signal, which has a linearity on the voltage fluctuation at the terminal VO2 in the range of $\Delta Vo2$ centering on the reference voltage VBG of the error amplifier 5 ($VBG=Vo \cdot R11/(R10+R11)$ where Vo is a detected voltage at the output voltage terminal VOUT), is transmitted to the switching element 6. The switching element 6 linearly changes current supply from the constant current source 4 to the switching element 8 by using the output signal, so that the current IPC at the terminal PC changes to a current signal having linearity on the voltage fluctuation at the terminal VO2 via the current mirror circuit (a mirror ratio is denoted as α) including the switching elements 7 and 8.

Figure 10:
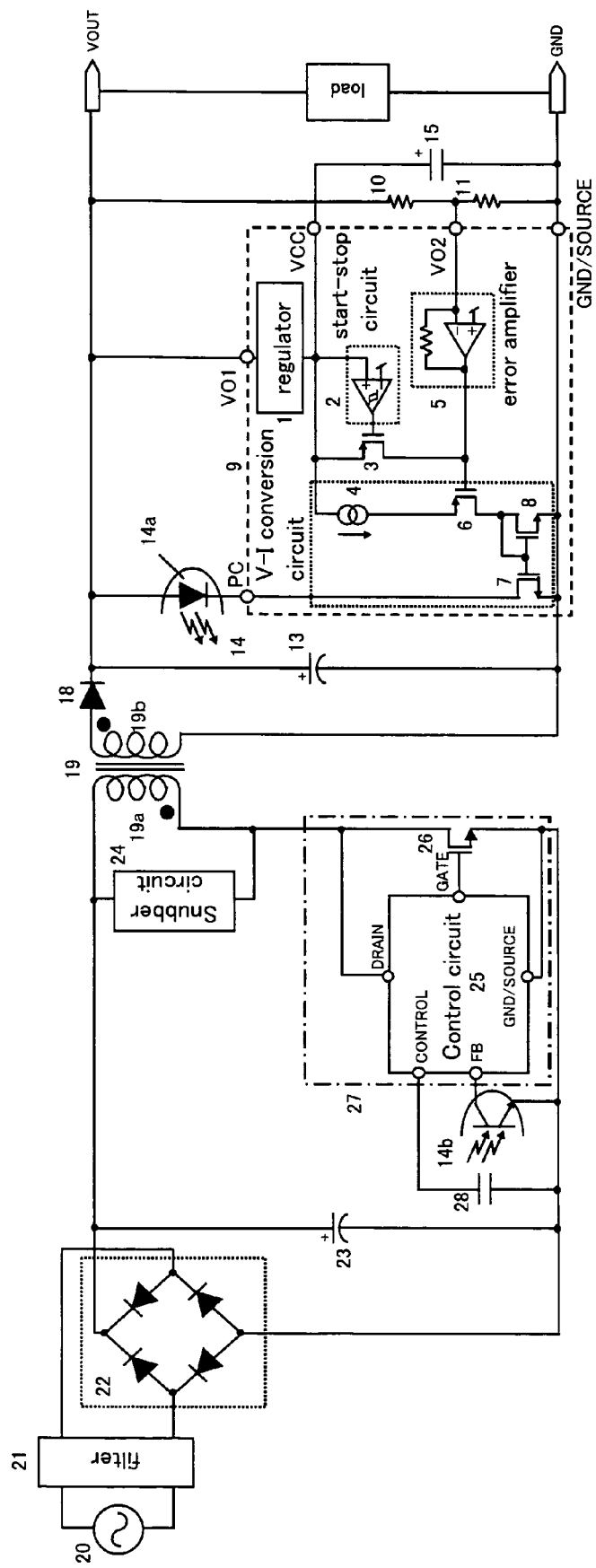
FIG. 10 is a circuit diagram showing the configuration of a first power supply unit using the voltage detection circuit shown in FIG. 2.

As shown in FIG. 3, when the load of the output voltage terminal VOUT is no load (VO1≧VO+ΔVo/2), a current expressed by the equality $$IPC = I4 \times \alpha \text{ (α is a mirror ratio)}$$

flows through the light emitting portion 14a of the optical coupler 14 to transmit an optical signal to a light receiving portion 14b of the optical coupler 14 (see FIG. 10).

When the load of the output voltage terminal VOUT is a light load (VO−ΔVo/2≦VO1≦VO+ΔVo/2), a current having linearity expressed by the inequality $$0 \leq IPC \leq I4 \times \alpha \text{ (α is a mirror ratio)}$$

flows through the light emitting portion 14a of the optical coupler 14, so that an optical signal flowing into the light receiving portion 14b of the optical coupler 14 also has linearity.

Further, when the load of the output voltage terminal VOUT is a heavy load (VO1≦VO−ΔVo/2), no current flows into the light emitting portion 14a of the optical coupler 14, so that an optical signal is not transmitted to the light receiving portion 14b of the optical coupler 14.

As described above, the voltage detecting semiconductor device 9 transmits the current signal having linearity on the voltage fluctuation at the output voltage terminal VOUT from the terminal PC to the outside. The control of power supply to the output voltage terminal VOUT by means of the current signal from the voltage detecting semiconductor device 9 allows voltage control to bring about the relationship VOUT=VO.

When the power supply to the output voltage terminal VOUT is controlled by using the voltage detecting semiconductor device 9, the following effects are obtained.

(1) Sine the current IPC(=α·I4 where α is a mirror ratio) flowing into the light emitting portion 14a of the optical coupler can be controlled by the current mirror circuit including the constant current source 4, the switching element 6, the switching element 7, and the switching element 8 which are the components of the voltage detecting semiconductor device 9, power consumption during the voltage detection can be reduced by reducing the current IPC. Further, since the circuit current of the voltage detecting semiconductor device 9 is reduced as described earlier, power consumed during normal operation can be reduced. The total value of the current consumed by the voltage detecting semiconductor device 9, the resistors 10 and 11, and the optical coupler 14 can be concretely reduce to about one-tenth or less the current values of conventional voltage detection circuits.

(2) Since an optimum power can be supplied in such a way that VOUT=VO is effected based on VOUT=VO±ΔVo/2 in relation to the output voltage terminal VOUT, ripple voltage at the output voltage terminal VOUT can be suppressed.

(3) Since the voltage detection circuit has only six components, that is, the semiconductor device 9, the resistors 10 and 11, the optical coupler 14, the smoothing capacitor 13, and the capacitor 15, the number of the components is reduced.

(Second Embodiment)

Figure 4:
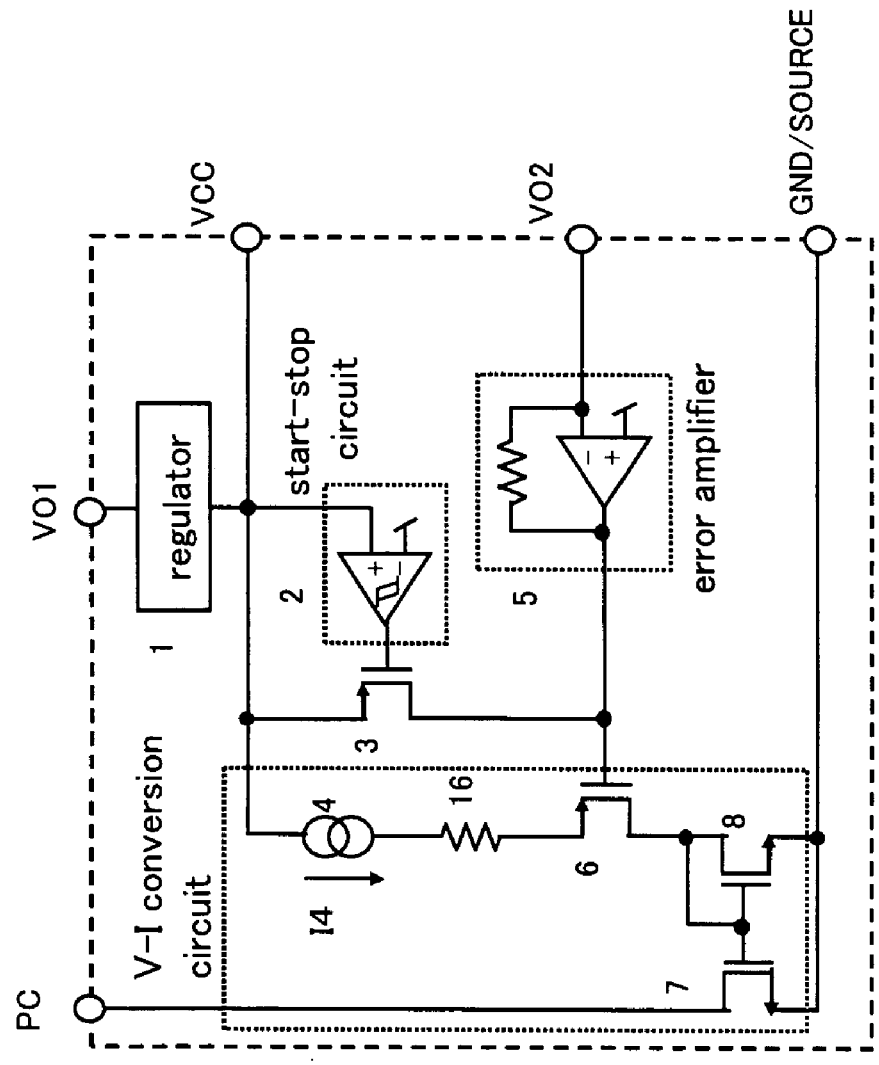
FIG. 4 is a circuit diagram showing the configuration of the semiconductor device according to a second embodiment of the invention.
Figure 5:
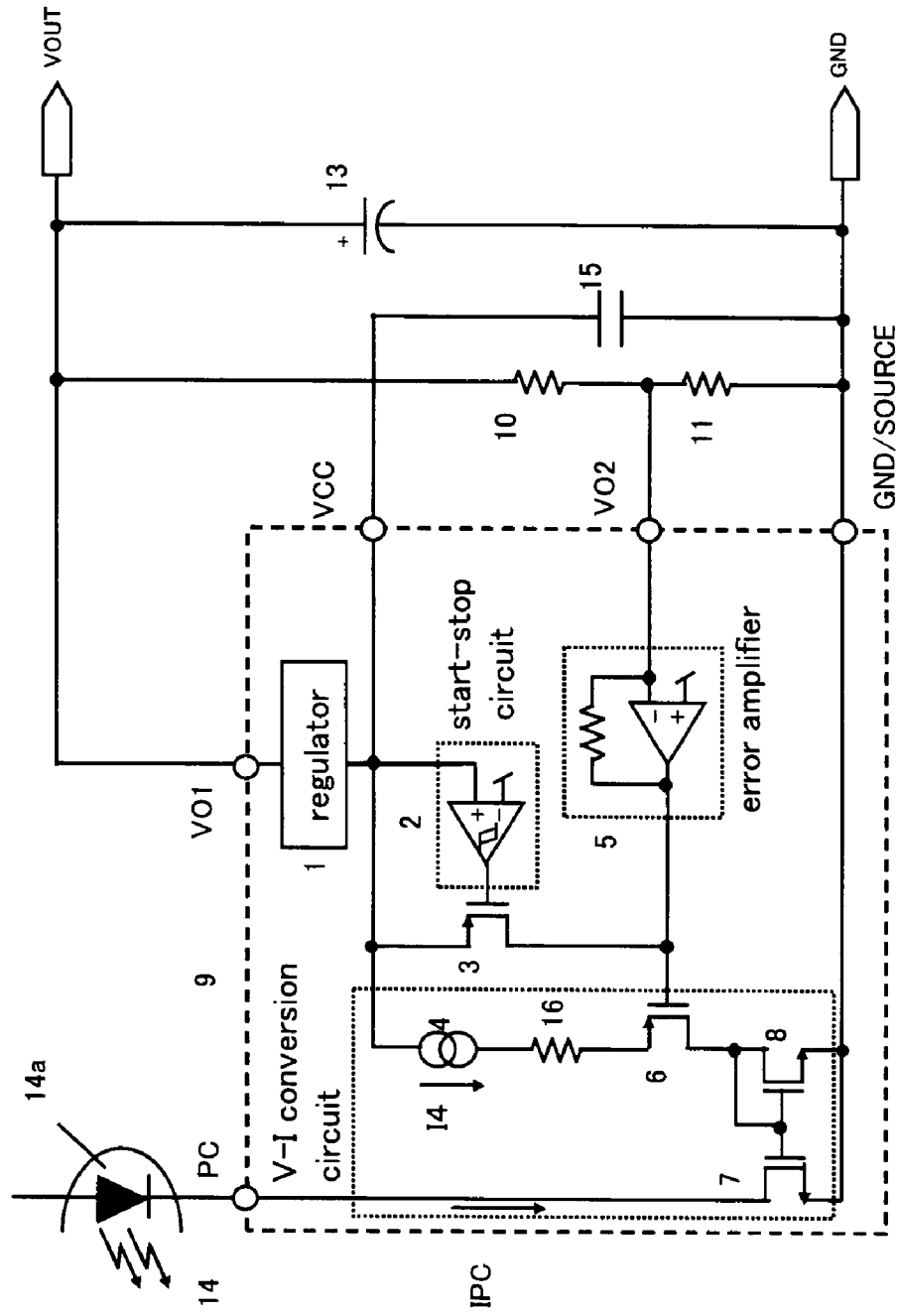
FIG. 5 is a circuit diagram showing a voltage detection circuit according to the second embodiment of the invention.
Figure 6:
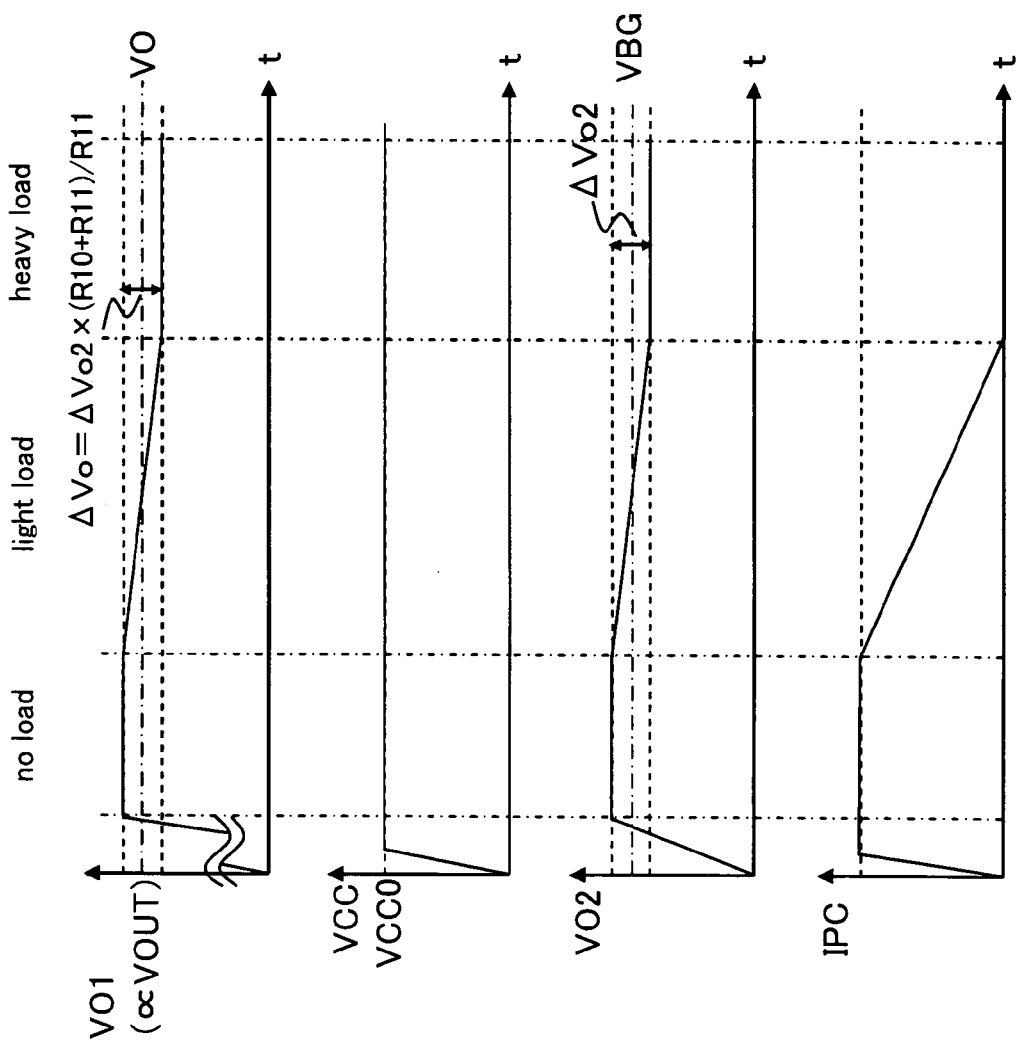
FIG. 6 is a waveform graph showing the operation of the voltage detection circuit shown in FIG. 5.

FIG. 4 is a circuit diagram showing the configuration of a semiconductor device according to a second embodiment of the invention. FIG. 5 is a circuit diagram showing a voltage detection circuit using the semiconductor device shown in FIG. 4. FIG. 6 is a graph showing the waveforms of voltages at the terminal VO1, the terminal VCC, and the terminal VO2 of the voltage detection circuit and the waveform of the current IPC.

The semiconductor device shown in FIG. 4 has a resistor 16 in addition to the configuration shown in FIG. 1; the resister 16 is connected between the constant current source 4 and the switching element 6. The provision of the resistor 16 makes it possible to improve the linearity of the current IPC against the voltage fluctuation at the terminal VO2 (that is, the voltage fluctuation at the output voltage terminal VOUT) when a load at the output voltage terminal VOUT is a light load (VO−ΔVo/2≦VO1≦VO+ΔVo/2). The other configuration, operation, and characteristics are the same as those shown in FIG. 1.

(Third Embodiment)

Figure 7:
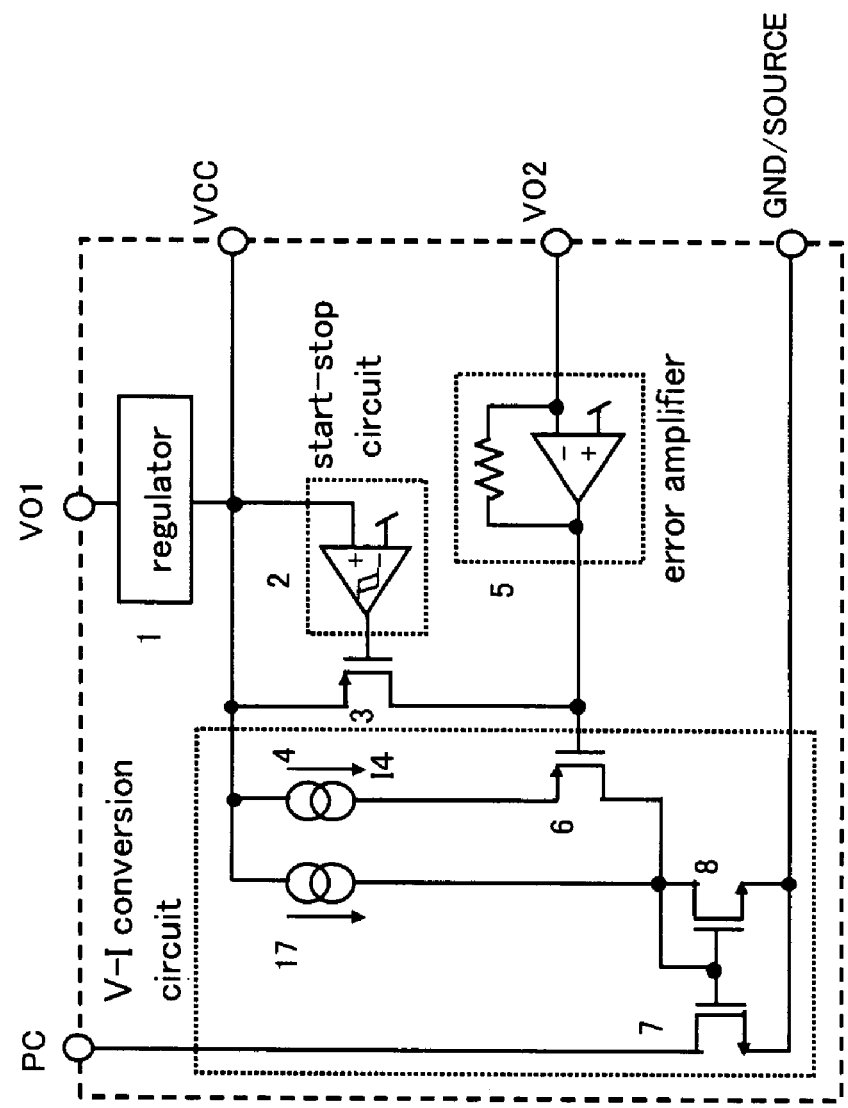
FIG. 7 is a circuit diagram showing the configuration of a semiconductor device according to a third embodiment of the invention.
Figure 8:
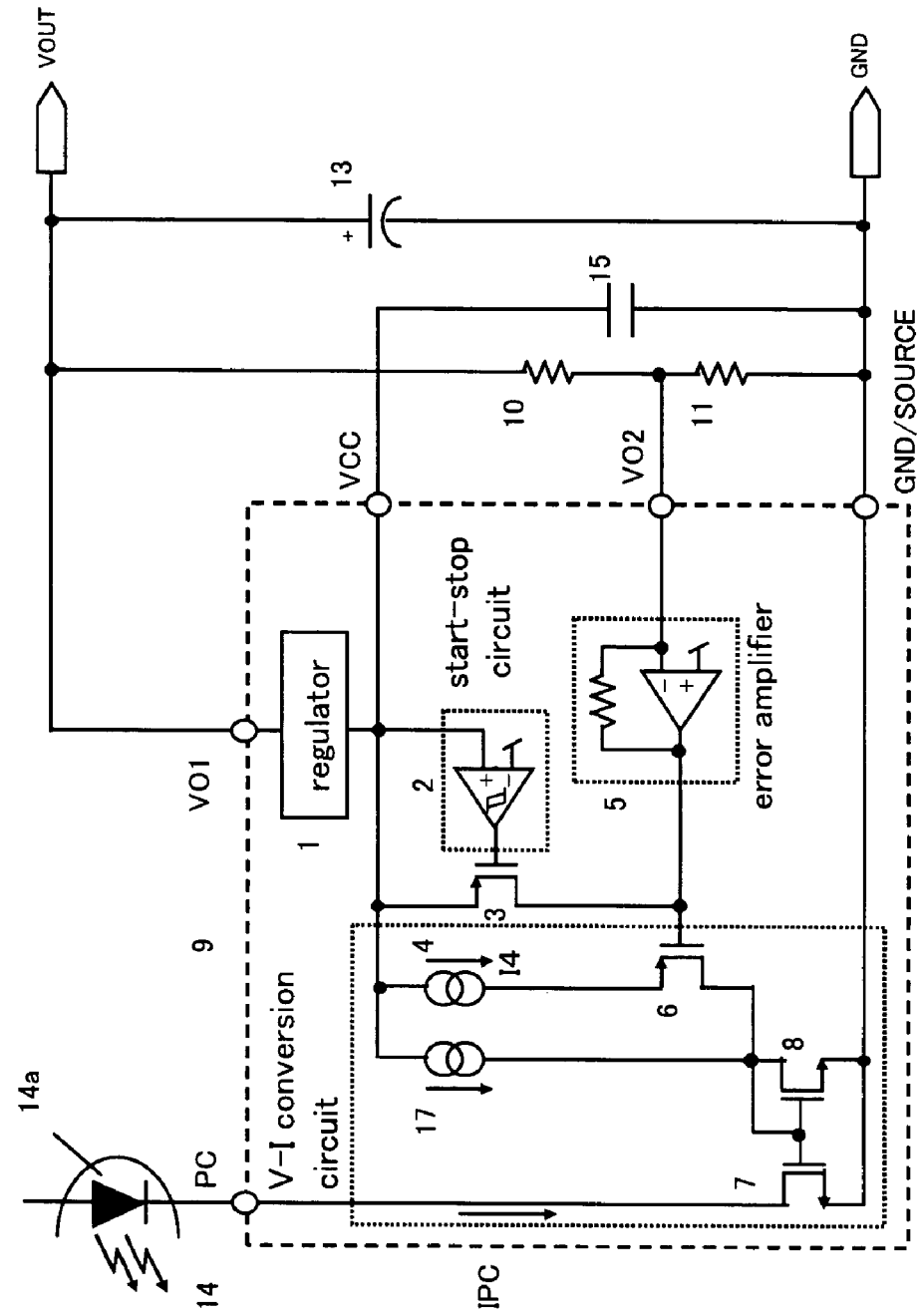
FIG. 8 is a circuit diagram showing a voltage detection circuit according to the third embodiment of the invention.
Figure 9:
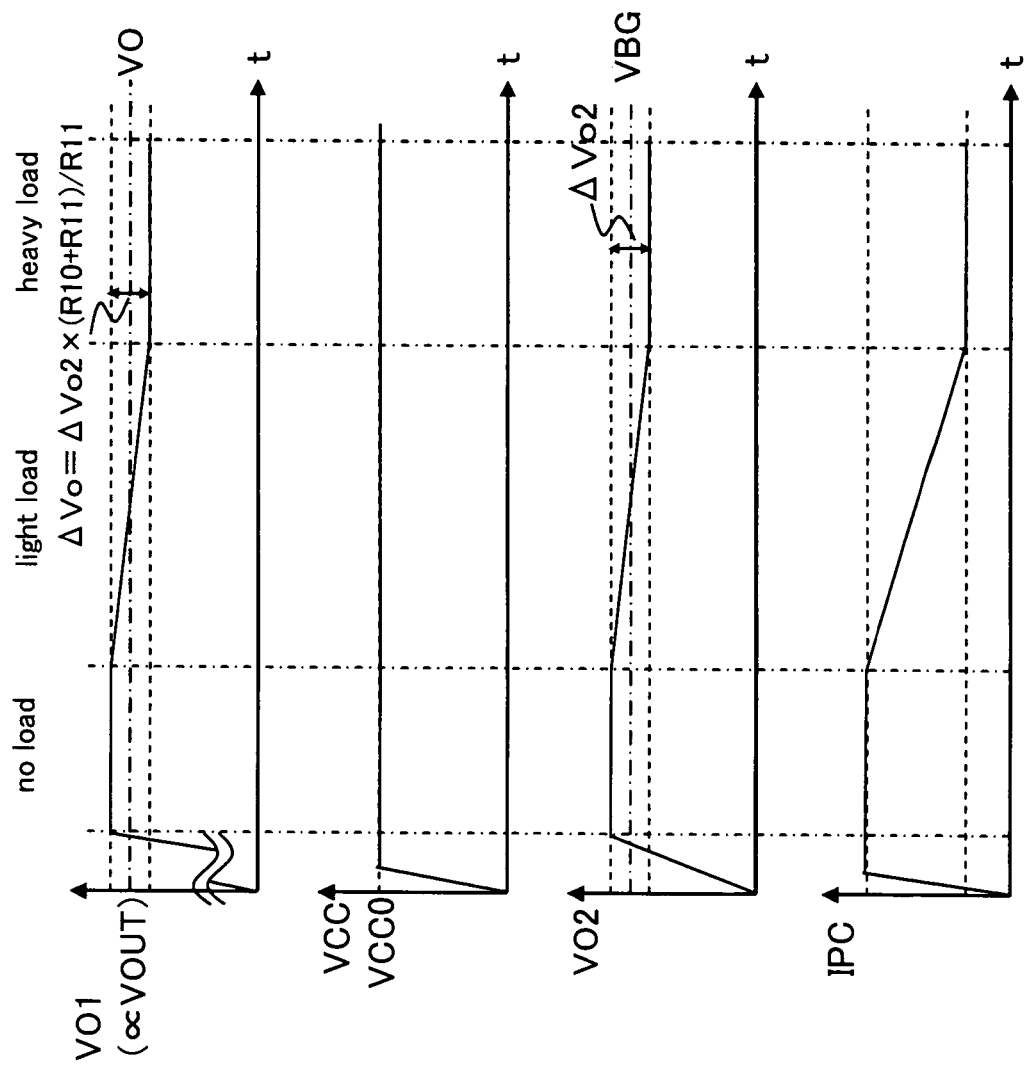
FIG. 9 is a waveform graph showing the operation of the voltage detection circuit shown in FIG. 8.

FIG. 7 is a circuit diagram showing the configuration of a semiconductor device according to a third embodiment of the invention. FIG. 8 is a circuit diagram showing a voltage detection circuit using the semiconductor device shown in FIG. 7. FIG. 9 is a graph showing the waveforms of voltages at the terminal VO1, the terminal VCC, and the terminal VO2 of the voltage detection circuit and the waveform of the current IPC.

The semiconductor device shown in FIG. 7 has a constant current source 17 in addition to the configuration shown in FIG. 1; the constant current source 17 is connected in parallel to the constant current source 14 and the switching element 6. The provision of the constant current source 17 brings about the flow of a certain constant current α·I17 into the light emitting portion 14a of the optical coupler when the voltage at the output voltage terminal VOUT are below the desired voltage VO, but the other components, operations, and characteristics are the same as those shown in FIG. 1. I17 denotes current of the constant current source 17. Although the light emitting portion 14a of the optical coupler does not emit light by the current I17, the connection of the constant current source 17 always makes the gate voltages at the switching element 7 and the switching element 8 set to a "H(high)" state during the detection of the voltage at the output voltage terminal VOUT by the voltage detecting semiconductor device 9, which ensures the operation of the semiconductor device.

Next, a power supply unit according to an embodiment of the invention will be explained.

FIG. 10 is a circuit diagram showing the configuration of a switching power supply unit including a transformer. This power supply unit represents a first power supply unit employing the voltage detection circuit shown in FIG. 2. The voltage of an input voltage power supply 20 is rectified by a rectifier circuit 22 via a filter circuit 21 and is smoothed by a smoothing capacitor on the input side 23. The voltage smoothed by the smoothing capacitor on the input side 23 is transferred to the primary winding 19a of the transformer 19, and the energy of the voltage is transmitted to the secondary winding 19b of the transformer by switching effected by the switching element 26 of a control circuit 25. Here, as shown by a section 27 in FIG. 10, the incorporation of the control circuit 25 and the switching element 26 on a single substrate brings advantages that the number of the components and the production cost of the power supply unit can be reduced.

The energy transmitted to the secondary winding 19b is supplied to the semiconductor device 9 on the output side, the resistors 10 and 11, and the optical coupler 14 via a rectifier circuit 18. Voltages at both ends of a smoothing capacitor on the output side 13 are divided by the resistor 10 and 11 and controlled to a desired voltage by the voltage detecting semiconductor device 9. The control operation of the semiconductor device 9 is the same as that explained with reference to FIG. 3, and the power supply unit features reduced power consumption, low ripple voltage, and output voltage with high accuracy. Since an output signal having linearity on the voltage fluctuation at the output voltage terminal VOUT is transmitted from the light emitting portion 14a of the optical coupler to the light receiving portion 14b of the optical coupler, the control circuit 25 makes it possible to supply power according to the load state at the output voltage terminal VOUT by means of the switching element 26 via the transformer 19. Even when the voltage detection circuits shown in FIGS. 5 and 8 are used in place of the voltage detection circuit shown in FIG. 2, the same operation can be obtained.

Figure 11:
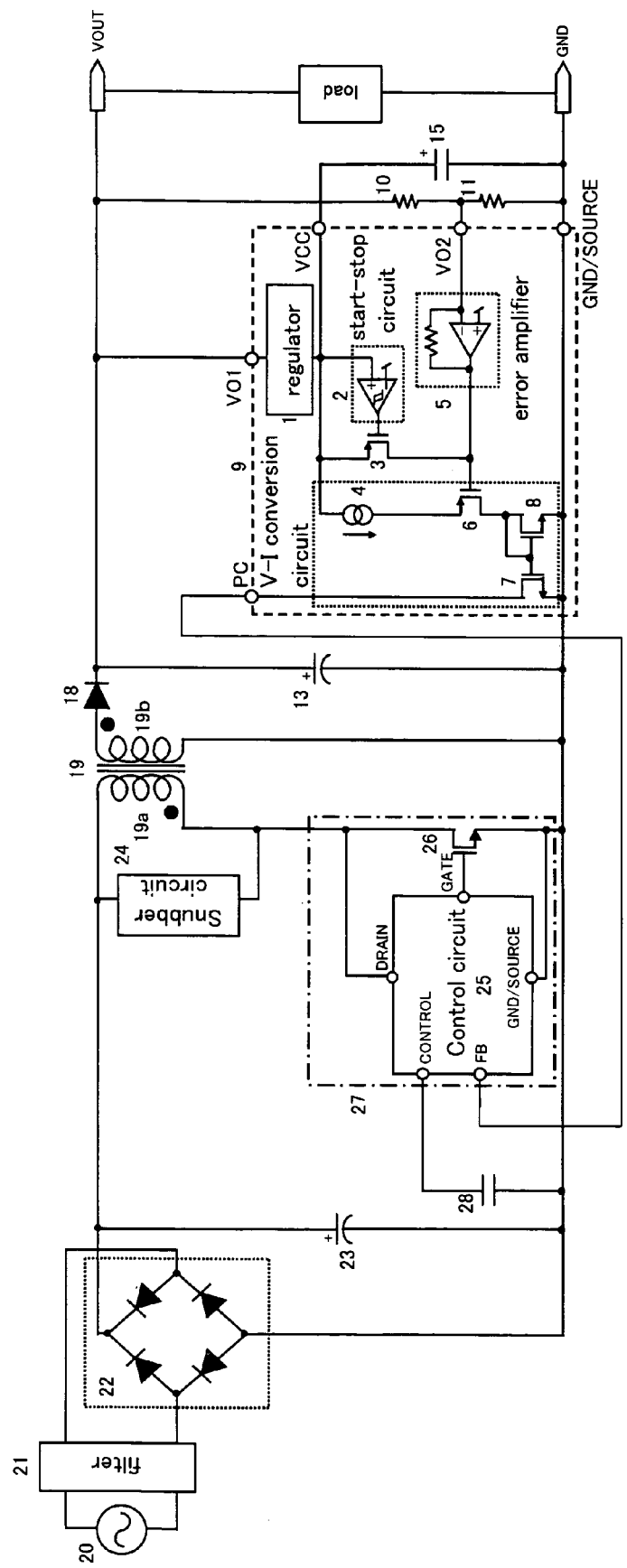
FIG. 11 is a circuit diagram showing the configuration of a second power supply unit using the voltage detection circuit shown in FIG. 2.

FIG. 11 is a circuit diagram showing the configuration of a non-insulated switching power supply unit including a transformer but not including the optical coupler 14 shown in FIG. 10. The switching power supply unit represents a second power supply unit employing the voltage detection circuit shown in FIG. 2 and has the same configuration, operation, and characteristics as those shown in FIG. 10 except that the optical signal transmitted from the voltage detecting semiconductor device 9 to the control circuit 25 is changed to a current signal. As shown by a section 27 in FIG. 11, the incorporation of the control circuit 25 and the switching element 26 on the same substrate brings advantages that the number of the components and the production cost of the power supply unit can be reduced like the unit shown in FIG. 10. Even when the voltage detection circuits shown in FIGS. 5 and 8 are used in place of the voltage detection circuit shown in FIG. 2, the same operation can be obtained.

Figure 12:
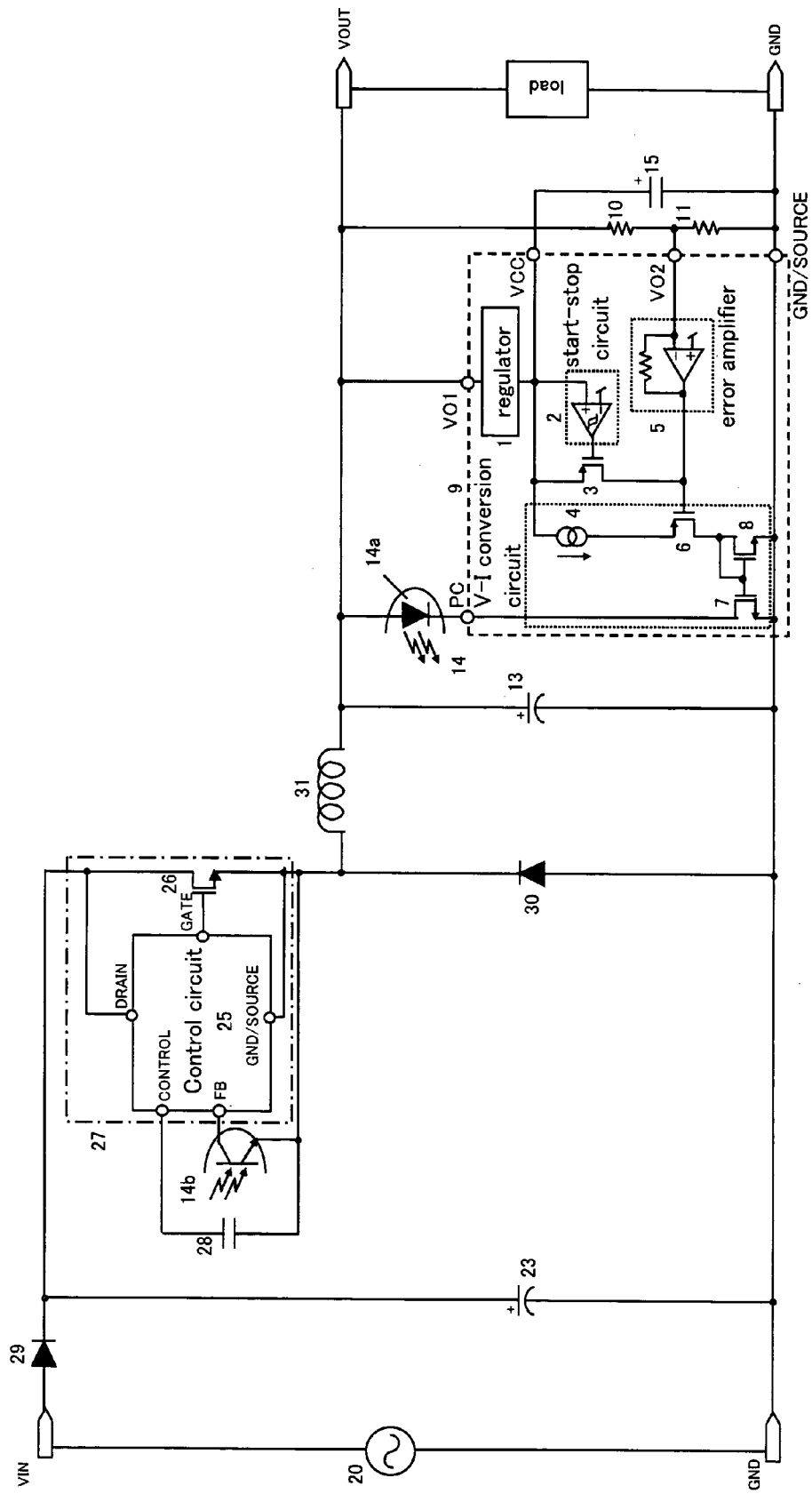
FIG. 12 is a circuit diagram showing the configuration of a third power supply unit using the voltage detection circuit shown in FIG. 2.

FIG. 12 is a circuit diagram showing the configuration of a step-down chopper-type switching power supply unit including a coil. The switching power supply unit represents a third power supply unit employing the voltage detection circuit shown in FIG. 2. The power of the input voltage power supply 20 is input via a terminal VIN shown in FIG. 12, and the voltage of the power is rectified by a rectifier circuit 29 comprised of a diode and is smoothed by the smoothing capacitor on the input side 23. When the switching element 26 of the control circuit 25 is in an ON state, the voltage smoothed by the smoothing capacitor on the input side 23 is supplied from a coil 31 to the smoothing capacitor on the output side 13. On the contrary, when the switching element 26 is in an OFF state, the voltage smoothed is supplied from a regenerating diode 30 to the smoothing capacitor on the output side 13 via the coil 31. Here, as shown by the section 27 in FIG. 12, the incorporation of the control circuit 25 and the switching element 26 on the same substrate brings advantages that the number of the components and the production cost of the power supply unit can be reduced like the unit shown in FIGS. 10 and 11.

Voltages at both ends of the smoothing capacitor on the input side 13 are divided by the resistors 10 and 11 and controlled to a desired voltage by the voltage detecting semiconductor device 9. The control operation of the semi-conductor device 9 is the same as that described with reference to FIG. 3, and the power supply unit features reduced power consumption, low ripple voltage, and output voltage with high accuracy. When an output signal is transmitted from the light emitting portion 14a of the optical coupler to the light receiving portion 14b of the optical coupler, the light receiving portion 14b is brought into an ON state, so that the on-off control of the switching element 26 is stopped by the control circuit 25, which stops power supply to the smoothing capacitor on the output side 13. Even when the voltage detection circuits shown in FIGS. 5 and 8 are used in place of the voltage detection circuit shown in FIG. 2, the same operation can be obtained.

Figure 13:
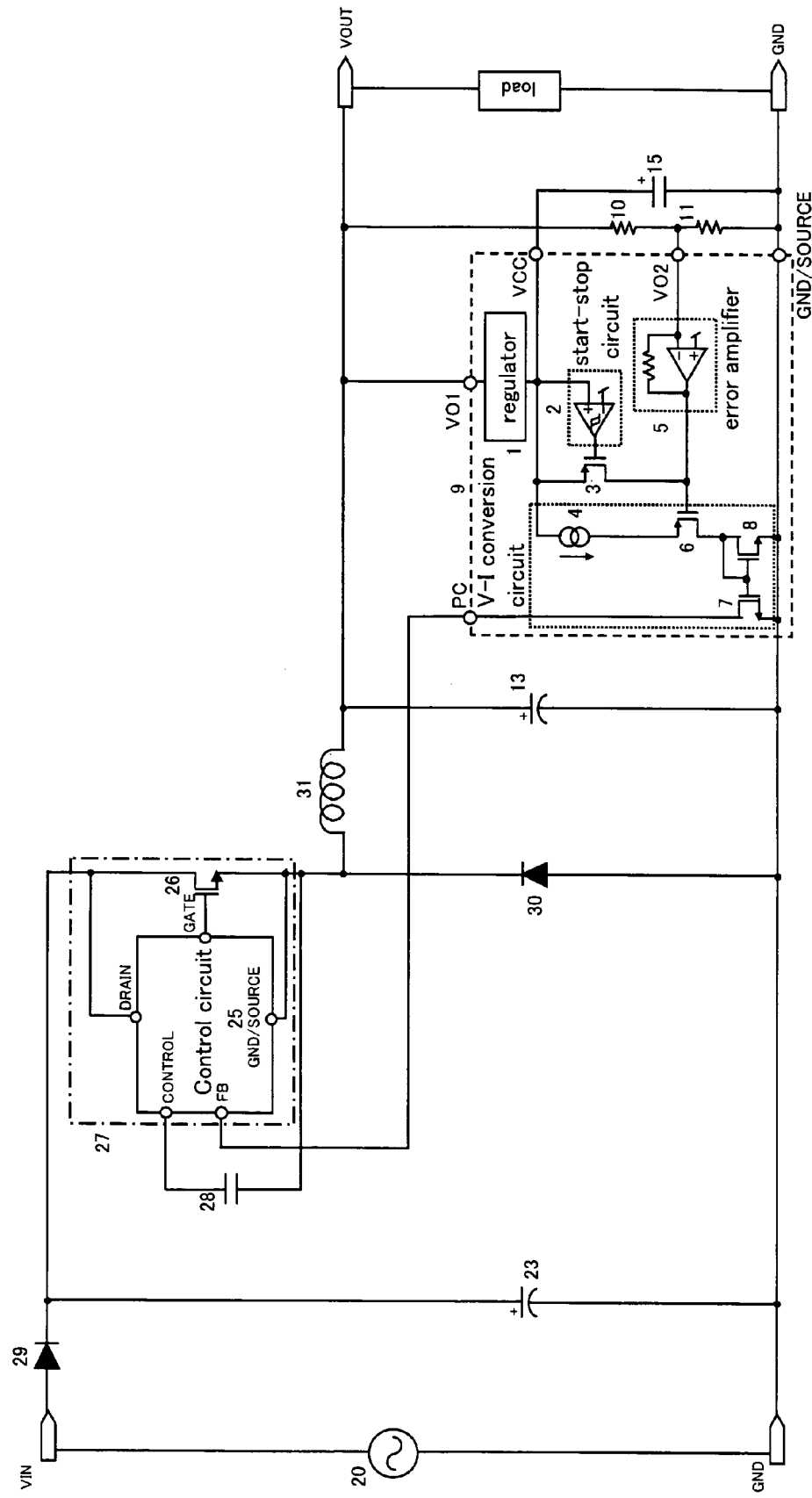
FIG. 13 is a circuit diagram showing the configuration of a fourth power supply unit using the voltage detection circuit shown in FIG. 2.
Figure 14:
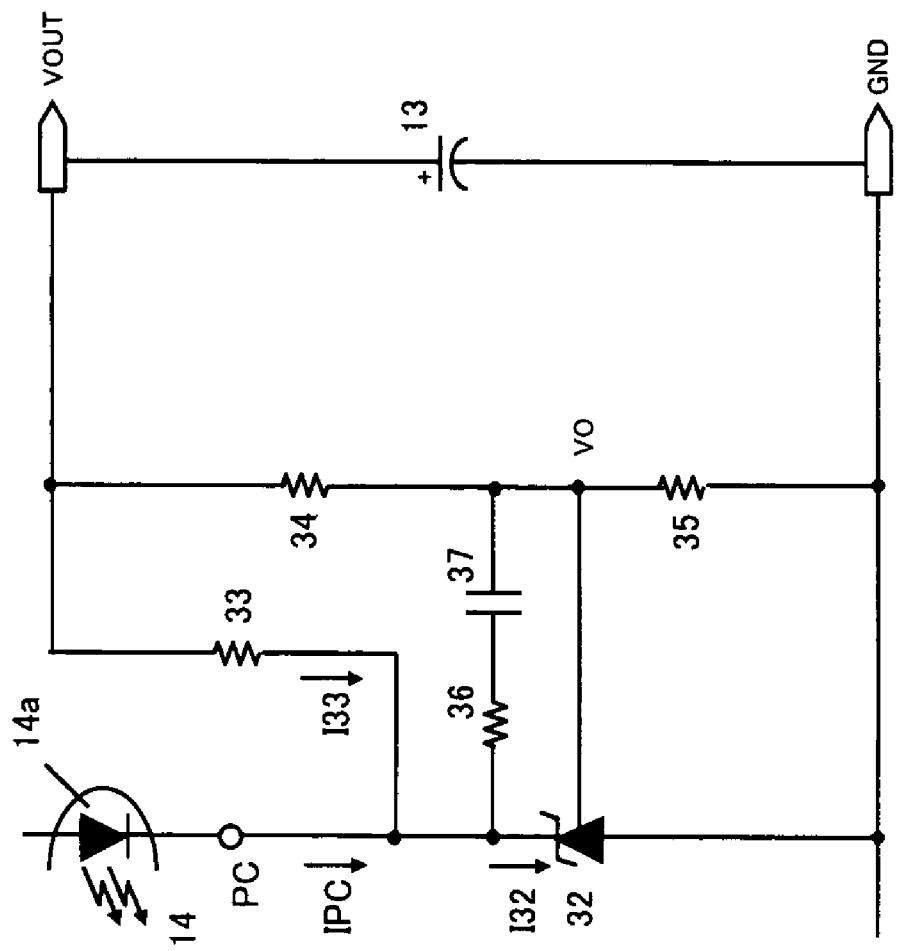
FIG. 14 is a circuit diagram showing a conventional voltage detection circuit.
Figure 15:
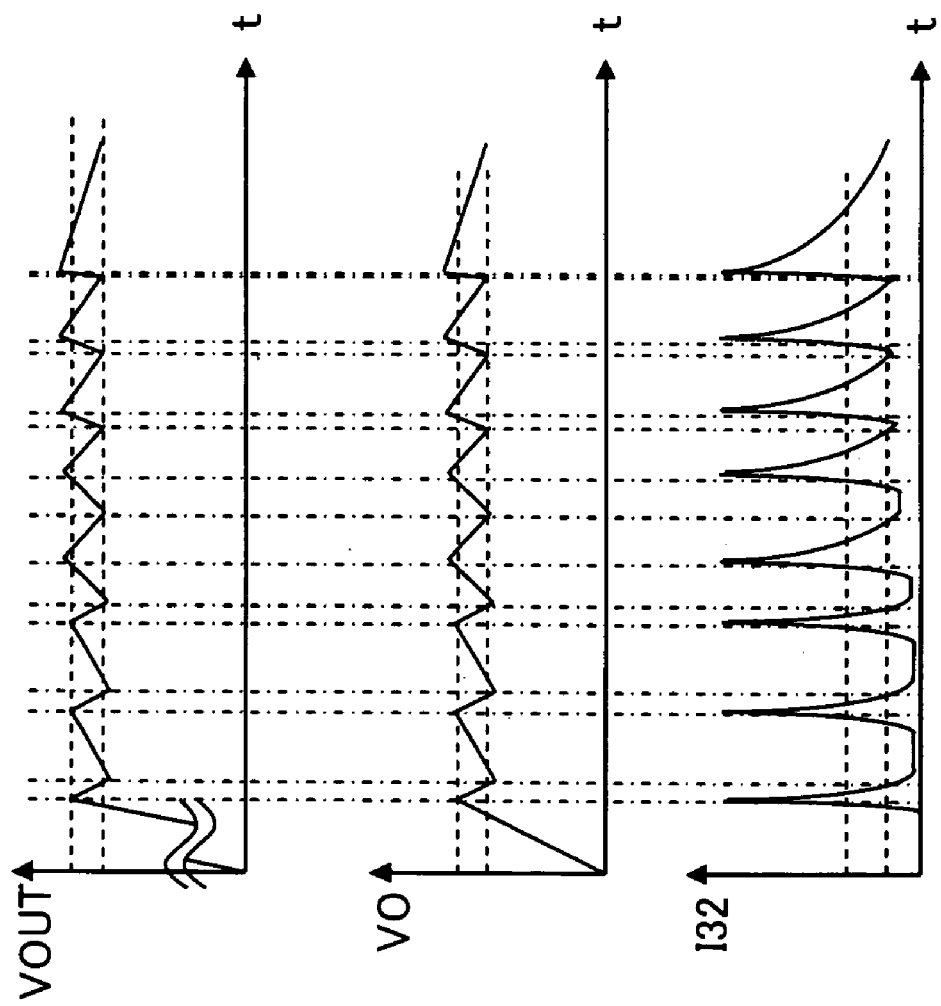
FIG. 15 is a waveform graph showing the operation of the voltage detection circuit shown in FIG. 14.
Figure 16:
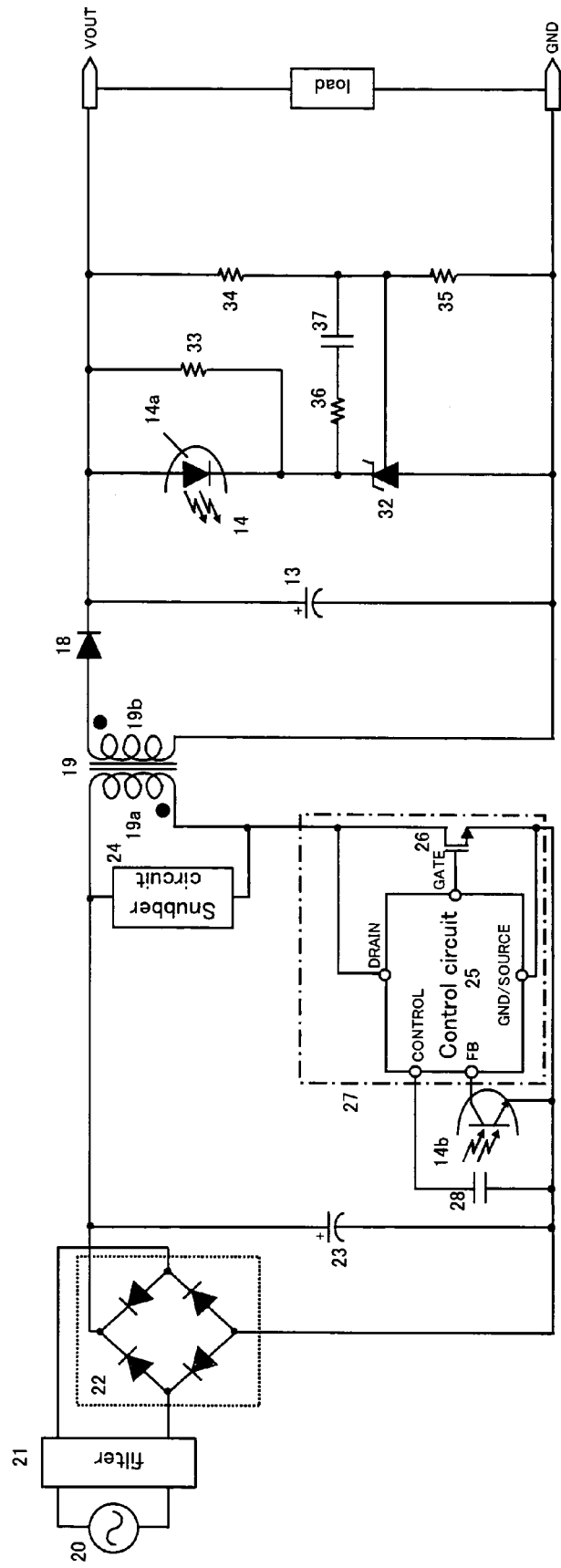
FIG. 16 is a circuit diagram showing the configuration of a power supply unit using the voltage detection circuit shown in FIG. 14.

FIG. 13 is a circuit diagram showing the configuration of a step-down chopper-type switching power supply unit including a coil. The switching power supply unit represents a fourth power supply unit employing the voltage detection circuit shown in FIG. 2. In the step-down chopper-type switching power supply unit shown in FIG. 12, the optical coupler 14 is used as a voltage detection signal transmission unit; however, in FIG. 13, by directly connecting the terminal PC of the voltage detecting semiconductor device 9 to the FB terminal used for stopping the on-off control of the switching element 26 by using the control circuit 25, the voltage fluctuation at the output voltage terminal VOUT is transmitted to the control circuit 25 as current signals. Here, as to the switching element 7, it is necessary to use an element with a high withstand voltage when input voltage VIN is high. The control operation of the control circuit 25 is the same as that described with reference to FIG. 12, and the power supply unit features reduced power consumption, low ripple voltage, and output voltage with high accuracy.

In the step-down chopper-type switching power supply unit shown in FIG. 13, even when the voltage detection circuits shown in FIGS. 5 and 8 are used in place of the voltage detection circuit shown in FIG. 2, the control operation is the same as that described with reference to FIG. 12, and the power supply unit features reduced power consumption, low ripple voltage, and output voltage with high accuracy. Here the relationship between a current value IPC and a current value IFB, which flows from the FB terminal in order to perform the on-off control of the switching element 26 by the control circuit 25, is IFB>IPC. The current value IFB is the FB terminal current capacity of the control circuit 25, and the current value IPC is the PC terminal current capacity of the semiconductor device for detecting output voltage 9. If the relationship is not IFB>IPC, the on-off control of the switching element 26 cannot be done by the control circuit 25.

The invention is available for equipment which have the necessity of detecting a voltage and transmitting the detected signal to a control circuit and, more particularly, is useful for products using a power supply unit, such as household electrical appliances, lighting fixtures, and motors.

The invention claimed is:

1. A voltage detection circuit comprising:
   a first smoothing capacitor connected between an output terminal on the high potential side and an output terminal on the low potential side;
   first and second resistors connected in series to each other between the output terminal on the high potential side and the output terminal on the low potential side;
   an error amplifier which amplifies an error voltage between a first voltage, which is determined by dividing a desired voltage between the output terminal on the high potential side and the output terminal on the low potential side by means of the first and second resistors, and a second voltage, which is determined by dividing an actual voltage between the output terminal on the high potential side and the output terminal on the low potential side by means of the first and second resistors, and which outputs the error voltage amplified;

a regulator which outputs a steady potential to a reference voltage terminal when a high potential is supplied to the output terminal on the high potential side;

a second capacitor connected between the reference voltage terminal and the output terminal on the low potential side;

a current mirror circuit which has a first switching element whose control terminal is connected to the output terminal of the error amplifier and which has a first constant current source connected between the reference voltage terminal and the terminal on the high potential side of the first switching element and which feeds a current, which is predetermined times larger than a current which flows from the first constant current source, into a detected signal output terminal according to the state of the first switching element;

a switching element for starting connected between the reference voltage terminal and the control terminal of the first switching element; and a start-stop circuit which brings the switching element for starting to an OFF state when the potential at the reference voltage terminal is higher than or equal to a predetermined starting potential and which brings the switching element for starting to an ON state when the potential at the reference voltage terminal is less than the predetermined starting potential.

2. The voltage detection circuit according to claim 1, wherein the current mirror circuit comprises the first constant current source, the first switching element, a second switching element, and a third switching element, the second switching element having a control terminal and a terminal on the high potential side which are connected to the terminal on the low potential side of the first switching element and having a terminal on the low potential side connected to the output terminal on the low potential side, the third switching element having a control terminal connected to the control terminal of the second switching element, a terminal on the high potential side connected to the detected signal output terminal, and a terminal on the low potential side connected to the output terminal on the low potential side.

3. The voltage detection circuit according to claim 2, wherein the current mirror circuit has a resistor connected between the first constant current source and the first switching element.

4. The voltage detection circuit according to claim 2, wherein the current mirror circuit has a second constant current source connected in parallel to the first constant current source and the first switching element.

5. The voltage detection circuit according to claim 1 inclusive having a detected signal transmission unit which is connected to the detected signal output terminal and which transmits a signal corresponding to a current which flows into the detected signal output terminal to the outside.

6. The voltage detection circuit according to claim 1 incorporating the error amplifier, the regulator, the switching element for starting, the start-stop circuit, and the current mirror circuit into a single semiconductor device.

7. A power supply unit employing the voltage detection circuit according to claim 1 at an output voltage detecting section where a desired voltage is acquired by controlling a voltage between an output terminal on the high potential side and an output terminal on the low potential side.

8. A semiconductor device comprising the error amplifier, the regulator, the switching element for starting, the start-stop circuit, and the current mirror circuit which are components of the voltage detection circuit according to claim 1.

9. The voltage detection circuit according to claim 2 inclusive having a detected signal transmission unit which is connected to the detected signal output terminal and which transmits a signal corresponding to a current which flows into the detected signal output terminal to the outside.

10. The voltage detection circuit according to claim 3 inclusive having a detected signal transmission unit which is connected to the detected signal output terminal and which transmits a signal corresponding to a current which flows into the detected signal output terminal to the outside.

11. The voltage detection circuit according to claim 4 inclusive having a detected signal transmission unit which is connected to the detected signal output terminal and which transmits a signal corresponding to a current which flows into the detected signal output terminal to the outside.

* * * * *